United States Patent [19]
Yoshida et al.

[11] Patent Number: 5,496,799
[45] Date of Patent: Mar. 5, 1996

[54] METHOD FOR MAKING RARE EARTH SUPERCONDUCTIVE COMPOSITE

[75] Inventors: Manabu Yoshida, Ama; Izumi Hirabayashi, Nagoya, all of Japan

[73] Assignees: NGK Insulators, Ltd.; International Superconductivity Technology Center, Japan

[21] Appl. No.: 366,384

[22] Filed: Dec. 29, 1994

Related U.S. Application Data

[63] Continuation of Ser. No. 104,535, Aug. 11, 1993, abandoned.

[30] Foreign Application Priority Data

Aug. 25, 1992 [JP] Japan .................................. 4-226033

[51] Int. Cl.$^6$ ........................................ H01L 39/24
[52] U.S. Cl. .............................................. 505/450; 264/82
[58] Field of Search ................................ 505/450, 490, 505/500; 264/60, 61, 82

[56] References Cited

U.S. PATENT DOCUMENTS

| | | | |
|---|---|---|---|
| 5,011,823 | 4/1991 | Jin et al. | 505/1 |
| 5,084,436 | 1/1992 | Morimoto et al. | 505/1 |
| 5,231,076 | 7/1993 | Jeong et al. | 505/1 |
| 5,240,903 | 8/1993 | Shimoyama et al. | 505/1 |
| 5,248,660 | 9/1993 | Lee et al. | 505/1 |
| 5,262,391 | 11/1993 | Morita et al. | 505/1 |
| 5,270,292 | 12/1993 | Hojaji et al. | 505/1 |
| 5,278,137 | 1/1994 | Morita et al. | 505/1 |

FOREIGN PATENT DOCUMENTS

| | | |
|---|---|---|
| 0426164 | 5/1991 | European Pat. Off. . |
| 4-224111 | 8/1992 | Japan . |

OTHER PUBLICATIONS

Patent Abstracts of Japan, 04–310574 C1037, vol. 17, No. 135, pub. Mar. 19, 1993.
Patent Abstracts of Japan, 04–240115, C1014, vol. 17, No. 1, pub Jan. 5, 1993.
Patent Abstracts of Japan, 04–98714, E1236, vol. 16, No. 332, pub. Jul. 20, 1992.
Patent Abstracts of Japan, 03–173777, C0878, vol. 15 No. 421, pub. Oct. 25, 1991.
ISTEC Journal vol. 4 No. 3 1991, pp. 31–35, High Critical Current Y–system Bulk Superconductor by Platinum Doped Melt Growth Method.
Handbook for Super Fine Particles, edited by Shinroku Saito, published by Fuji Technosystem in 1990, distributed by Technology Materials Center Inc., pp. 908–917.
K. Nishio et al., Advances in Superconductivity II, Springer–Verlag (1990) pp. 873–876, Preparation of Ag–YBCO Composite Fine Powder by Spray–Pyrolysis.
Y. Saito Journal of Crystal Growth 109 (1991) pp. 426–431, Crystal growth and properties of $R_2Ba_2CuPtO_8$ (R=Ho, Er, Y), $R_2Ba_3Cu_2PtO_{10}$ and $Ba_4CuPt_2O_9$.
M. Murakami, Supercond. Sci. Technol. 5 (1992) pp. 185–203, Processing of bulk YBaCuO.

Primary Examiner—Christopher A. Fiorilla
Attorney, Agent, or Firm—Parkhurst, Wendel & Rossi

[57] ABSTRACT

A method for making a rare earth superconductive composite which includes a matrix of $REBa_2Cu_3O_{7-x}$ grains and fine particles of $RE_2BaCuO_5$ dispersed therein. The method includes a step of forming a compacted mass of powder particles of $REBa_2Cu_3O_{7-x}$ and powder particles of $RE_2BaCuO_5$, each of which has an average diameter not greater than 6 µm, and a maximum diameter not greater than 20 µm. The compacted mass is heated to temperature higher than an incongruent melting temperature of the $REBa_2Cu_3O_{7-x}$ and lower than an incongruent melting temperature of $RE_2BaCuO_5$, and is gradually cooled such that fine particles of $RE_2BaCuO_5$ are dispersed in $REBa_2Cu_3O_{7-x}$ grains. The mass is annealed in an atmosphere containing oxygen.

12 Claims, No Drawings

METHOD FOR MAKING RARE EARTH SUPERCONDUCTIVE COMPOSITE

This is a continuation of application Ser. No. 08/104,535 filed Aug. 11, 1993, now abandoned.

BACKGROUND OF THE INVENTION

The present invention relates to a method for making a rare earth superconductive composite.

A superconductive material loses electrical resistance at temperatures at or below a critical temperature. Recently, a new class of rare earth-alkaline earth-copper oxide was discovered to be a superconductive material having a critical temperature above 77K, which is a boiling point of liquid nitrogen. This type of compound has an approximate unit formula of $YBa_2Cu_3O_{7-x}$, where x is typically about 0, and x represents oxygen deficiency. Crystalline structure of this type of rare earth oxide superconductors have a perovskite structure with the oxygen deficiency.

Any superconductor can be classified into either type I superconductor or type II superconductor. When the type I superconductor is exposed to magnetic field below a critical magnetic field, the superconductor shows complete diamagnetism due to the Meissner effect, and magnetic flux can not penetrate inside the superconductor. A supercurrent flows at the surface of the superconductor so as to cancel the external magnetic field. At the critical magnetic field the superconductor undergoes a transition from a superconductive phase to a non-superconductive phase, and magnetic flux begins to penetrate the inside the superconductor.

The type II superconductor exposed to magnetic field below the first magnetic field behaves like the type I superconductor, and magnetic flux can not penetrate inside the superconductor due to the Meissner effect. At the first critical magnetic field the superconductor undergoes a transition from a superconductive phase to a mixed phase, and magnetic flux begins to penetrate the inside the superconductor while maintaining superconductivity. At the second critical magnetic field the type II superconductor undergoes a phase transition from this mixed state to a non-superconductive state. The oxide superconductor belongs to type II superconductor.

When an electric current is applied to the type II superconductor in the mixed state, magnetic flux moves due to Lorenz force thereby showing electrical resistance. However, when pinning centers, which include, for example, diamagnetic particles, are dispersed in the superconductor, the magnetic flux penetrates though the pinning centers so that magnetic flux is prevented from moving.

Recently, active studies have been reported to obtain a rare earth oxide superconductor having fine particles dispersed therein acting as pinning centers.

Japanese Patent Application Laid-Open No. 4-224111 discloses a use of a platinum group element with a partial melt process so as to disperse fine particles of $RE_2BaCuO_5$ (RE is Y, Gd, Dy, Ho, Er or Yb) in superconductive grains of $REBa_2Cu_3O_{7-x}$. The fine particles of $RE_2BaCuO_5$ work as pinning centers to prevent magnetic flux from moving in the resulting superconductive composite. The process includes the steps of: heating a green compact including $REBa_2Cu_3O_{7-x}$ and at least one element of Rh, Pt, Pd, Ru, Os, and Sc to a temperature higher than an incongruent melting temperature of $REBa_2Cu_3O_{7-x}$ to partially melt $REBa_2Cu_3O_{7-x}$; slowly cooling the resulting material to recrystallize $REBa_2Cu_3O_{7-x}$ from the melt. The presence of a platinum group element, such as platinum and rhodium, in the melt is associated with a mechanism to disperse fine particles of $RE_2BaCuO_5$ in the slow cooling step.

Ogawa, Yoshida and Hirabayashi in ISTEC Journal, Vol. 4, No. 3, 1991, p. 30, describes a generally similar concept of a partial melting process in which a green compact includes a small amount of a platinum group element to make a rare earth superconductive composite in which fine particles of $Y_2BaCuO_5$, acting as pinning centers, are dispersed in superconductive grains of $REBa_2Cu_3O_{7-x}$.

SUMMARY OF THE INVENTION

An object of the present invention is to improve a critical current density of a superconductive composite in which fine particles of $RE_2BaCuO_5$, which work as pinning centers, are dispersed in a matrix of superconductive $REBa_2Cu_3O_{7-x}$ grains. In the present invention, small powder particles are used for both $REBa_2Cu_3O_{7-x}$ and $RE_2BaCuO_5$ in a compacted mass for the partial melt process, thereby making $RE_2BaCuO_5$ particles dispersed in the resulting composite smaller and increasing a number of the $RE_2BaCuO_5$ particles in a unit volume of the resulting composite. Smaller pinning centers and fine dispersion of pinning centers improve critical current density of the superconductive composite.

The present invention provides a method for making a rare earth superconductive composite including a matrix of $REBa_2Cu_3O_{7-x}$ grains and, uniformly dispersed therein, fine particles of $RE_2BaCuO_5$, wherein RE is at least one element selected from the group consisting of Y, Nd, Sm, Eu, Gd, Dy, Ho, Er, Tm, Yb, and Lu, and x ranges from 0 to 1, which comprises the steps of: (1) forming a compacted mass by application of pressure out of a powder material including $REBa_2Cu_3O_{7-x}$ and $RE_2BaCuO_5$ in a powder form wherein powder particles of $REBa_2Cu_3O_{7-x}$ have an average diameter up to 6 μm and a maximum diameter up to 20 μm, and powder particles of $RE_2BaCuO_5$ have an average diameter up to 6 μm and a maximum diameter up to 20 μm; (2) heating the compacted mass to a temperature which is higher than an incongruent melting temperature of $REBa_2Cu_3O_{7-x}$ and which is lower than an incongruent melting temperature of $RE_2BaCuO_5$ so as to partially melt and decompose the $REBa_2Cu_3O_{7-x}$ in the mass into a melt and $RE_2BaCuO_5$ in a solid state; (3) gradually cooling the mass so as to recrystallize $REBa_2Cu_3O_{7-x}$ from the melt wherein fine particles of $RE_2BaCuO_5$ are dispersed in grains of $REBa_2Cu_3O_{7-x}$; and (4) annealing the mass in an atmosphere containing oxygen for a time sufficient for the requisite amount of oxygen to diffuse into the mass. Gradually cooling the melt in step (3) gives rise to a peritectic reaction of $RE_2BaCuO_5$ in a solid state with the melt to give a crystal growth of $REBa_2Cu_3O_{7-x}$ at an interface of $RE_2BaCuO_5$ particles and the melt so that fine particles of $RE_2BaCuO_5$ are dispersed in grains of $REBa_2Cu_3O_{7-x}$. Fine particles of $RE_2BaCuO_5$ in the composite have a diameter up to 20 μm, and most of the fine particles are less than 5 μm. $RE_2BaCuO_5$ particles in the composite work as pinning centers.

Preferably the powder particles of $REBa_2Cu_3O_{7-x}$ have an average diameter up to 4 μm and a maximum diameter up to 15 μm, and the powder particles of $RE_2BaCuO_5$ have an average diameter up to 4 μm and a maximum diameter up to 15 μm. The powder material in step (1) may include an amount of $RE_2BaCuO_5$ ranging from 10% to 80% by mole of an amount of $REBa_2Cu_3O_{7-x}$.

The fine particles of $RE_2BaCuO_5$ have diameters up to 20 μm, and most of the fine particles may have diameters up to 10 μm. Diameters of most of the fine particles typically distribute around about 2 to about 4 μm.

Preferably the melt in step (3) further includes an effective amount of a species so as to disperse the fine particles of $RE_2BaCuO_5$ in step (3). The powder material in step (1) may further include the species so as to disperse the fine particles of $RE_2BaCuO_5$ in step (3), and the species may include at least one element selected from the group consisting of Pt, Rh, Pd, Ru, Os, Sc, and Ce so that the fine particles of $RE_2BaCuO_5$ in step (3) have a maximum diameter up to 20 μm. An amount of the one element may range from 0.01 to 10% by weight of the sum of $RE_2BaCuO_5$ and $REBa_2Cu_3O_{7-x}$ in the powder material.

Preferably step (2) further includes a step of maintaining the mass at a steady temperature ranging from 950° C. to 1250° C. for a sufficient time to partially melt $REBa_2Cu_3O_{7-x}$. In step (3) the mass may be gradually cooled from a temperature ranging from 1050° C. to 980° C. to a temperature ranging from 940° C. to 850° C. at a rate ranging from 0.1° C. to 2° C. per hour.

Preferably after step (2) and prior to step (3), the mass may be rapidly cooled to an initial temperature of the mass at step. (3) at a rate ranging from 50° C. to 400° C. per hour. In step (3) an initial temperature from which the mass is gradually cooled may be a temperature higher by 5° C. to 20° C. than the incongruent melting temperature of $REBa_2Cu_3O_{7-x}$, and an ending temperature to which the mass is gradually cooled is a temperature lower by at least 30° C. than the incongruent melting temperature of $REBa_2Cu_3O_{7-x}$.

DETAILED DESCRIPTION OF THE INVENTION

The superconductive composite obtained by the method of the present invention includes a matrix composed of grains represented by a formula $REBa_2Cu_3O_{7-x}$. In the formula, RE is at least one element selected from the group consisting of Y, Nd, Sm, Eu, Gd, Dy, Ho, Er, Tm, Yb, and Lu. $REBa_2Cu_3O_{7-x}$ has a multi-layered perovskite structure with oxygen deficiency shown by x. In the formula x is a number ranging from 0 to 1, and an oxygen content in $REBa_2Cu_3O_{7-x}$ is non-stoichiometric. A value of x has a direct influence on the superconductivity of the grains. An example of the formula includes $YBa_2Cu_3O_{7-x}$. The rare earth element represented by RE is not restricted to one element and may be a mixture of two or more elements selected from the group. An example of such mixed rare earth elements is that RE is shown as $Y_yYb_{1-y}$ where y ranges from 0 to 1.

A starting material for powder of $REBa_2Cu_3O_{7-x}$ and $RE_2BaCuO_5$ includes, for example, an oxide of RE, including Y, Gd, Dy, Ho, Er, and Yb; a carbonate, oxide or peroxide of Ba; and an oxide of Cu. To form a powder of $REBa_2Cu_3O_{7-x}$, a mixture including RE, Ba, and Cu in a molar ratio of 1:2:3 is sintered at a temperature ranging from 650° C. to 1,000° C., which is lower than an incongruent melting temperature of $REBa_2Cu_3O_{7-x}$, in an ambient atmosphere, and the sintered material is pulverized. Alternatively, the mixture may be heated to a temperature higher than the incongruent melting temperature to partially melt $REBa_2Cu_3O_{7-x}$ and then to cool the mass to solidify the melt.

To form powder of $RE_2BaCuO_5$, a mixture including RE, Ba, and Cu in a molar ratio of 2:1:1 is fired at a temperature ranging from 800° C. to 1,200° C. in an ambient atmosphere, and the fired material is pulverized, for example with a mill. An average particle size can be adjusted by a period of time for pulverizing the fired material.

Large particles may be eliminated by a sedimentation method using an appropriate solvent such as ethanol, and a sieving method. In the sedimentation method, powder particles are dispersed in a solvent, and larger particles fall quicker than smaller particles, thereby removing larger particles.

Powder particles having an average diameter of not more than about 3 μm may be obtained by a coprecipitation method using oxalates, a sol-gel method, or a spray-pyrolysis method.

In the sol-gel method, nitrates or acetates of a rare earth metal, barium, and copper are dissolved in an Organic solvent such as alcohol. Ethyleneglycol may be used as a solvent. An organic acid, for example, citric acid, tartaric acid, lactic acid, etc. is added to the starting solution to form metallic salts of the organic acid. Then the solvent is removed from the solution at a temperature ranging from about 70° C. to about 90° C. for a sufficient time, for example, over a period of scores of hours so as to change a sol to a gel to solidify. The solid obtained is pulverized, and then fired at about 800° C. for one to six hours to give fine powder. A molar ratio of RE:Ba:Cu in the starting solution is adjusted for a desired ratio such as 1:2:3 and 2:2:1.

In the spray pyrolysis method, a solution containing a rare earth metal, barium, and copper in a desired ratio is sprayed into a furnace which is heated to high temperatures in advance so as to pyrolyze the compound in the sprayed solution to give a composite oxide. This method is disclosed in "Advances in Superconductivity II" p873–876 by Springer-Verlag, 1990.

A compacted mass is obtained by application of pressure out of a powder material including $REBa_2Cu_3O_{7-x}$ and $RE_2BaCuO_5$ in a powder form. The powder material may consist essentially of 100 molar parts of $REBa_2Cu_3O_{7-x}$ and 10 to 80 molar parts of $RE_2BaCuO_5$, and further preferably 100 molar parts of $REBa_2Cu_3O_{7-x}$ and 20 to 50 molar parts of $RE_2BaCuO_5$. The ratio of the two starting materials are suitable for dispersing fine particles of $RE_2BaCuO_5$ in the resulting composite.

Preferably the powder material contains at least one element selected from the group consisting of Pt, Rh, Pd, Ru, Os, Sc, and Ce, and an amount the at least one element is preferably 0.01–10% by weight in proportion to the sum of $REBa_2Cu_3O_{7-x}$ and $RE_2BaCuO_5$. When at least one of Pt, Rh, Pd, Ru, and Os is used, an amount of the metal may preferably range from 0.1 to 5% by weight in proportion to the sum of $REBa_2Cu_3O_{7-x}$ and $RE_2BaCuO_5$. When Sc is used, an amount of scandium may range 0.1 to 3% by weight in the sum of $REBa_2Cu_3O_{7-x}$ and $RE_2BaCuO_5$. Powder particles of these elements in the powder material may have an average diameter up to 6 μm, and a maximum diameter up to 20 μm. These elements may be pure substance, binary oxides including, for example, $PtO_2$ and $Rh_2O_3$, or oxides which contain barium and a noble metal, including, for example, $Ba_4PtO_6$, $Ba_4CuPt_2O_9$, $Y_2Ba_2CuPtO_8$, $Y_2Ba_3Cu_2PtO_{10}$, $Ba_4CuRh_2O_9$, etc.

The oxide containing barium and a noble metal is obtained by heating a powder material including barium oxide, the noble metal, and the other oxides of constituent metals in a desired stoichiometry in an ambient atmosphere. For example, to form $Ba_4CuPt_2O_9$ in a powder form, a powder mixture composed of BaO, CuO, and $PtO_2$ in a molar ratio of 4:1:2 is sintered at about 950° C. for five hours in an ambient atmosphere, and the sintered material is pulverized. To form $Y_2Ba_3Cu_2PtO_{10}$ powder, a powder mixture composed of $Y_2O_3$, BaO, CuO, and $PtO_2$ so as to have a molar ratio of Y:Ba:Cu:Pt being 2:3:2:1 is sintered at about 1050° C. for five hours in an ambient atmosphere, and the sintered material is pulverized.

Alternatively, these elements may be added to the melt in the heated compact mass prior to a step of gradually cooling the mass. The presence of the elements in the melt of the partial melt process is related to disperse fine particles of $RE_2BaCuO_5$ uniformly dispersed in grains. These fine particles act as pinning centers, and their presence is preferable. These elements are dispersed uniformly in a form of particles in the $REBa_2Cu_3O_{7-x}$ grains of the resulting composite.

$REBa_2Cu_3O_{7-x}$ powder, $RE_2BaCuO_5$ powder, and optionally powder of a compound including at least one element of Pt, Rh, Pd, Ru, Os, Sc, and Ce are thoroughly mixed wet or dry. Alternatively a solution of the compound may be mixed with $REBa_2Cu_3O_{7-x}$ powder and $RE_2BaCuO_5$ powder, and the mixture is dried, and then pulverized to give a powder material.

A pressure is applied to the powder material to give a compacted mass. The powder material may be subjected to a known molding method, such as press molding, injection molding, cast molding, isotropic press molding, etc. to form a desired shape.

The compacted mass has any shape, including a disk, a cylinder, a prism, a parallelepiped, a rectangular parallelepiped, a cone, a pyramid, a spheroid, a sphere, a shape obtained by subjecting any of the above shapes to plastic deformation in any desired direction, a shape obtained by cutting any of the above shapes in any direction so as to give a flat or curved surface, and a shape obtained by making at least one hole in any of the above shapes, such as a cylindrical tube.

As disclosed in the U.S. patent application Ser. No. 08/037,005, sharing a common assignee with the present application, now abandoned and its corresponding European patent application 93302556.1, the compacted mass to be heated may include a small amount of silver so that the resulting composite includes particles containing silver thereby ensuring resilience to crack formation in $REBa_2Cu_3O_{7-x}$ grains. As disclosed in the U.S. patent application Ser. No. 08/037,005 and its corresponding European patent application 93302556.1, the compacted mass may include a small amount of a silver compound having a gradation in its concentration through the mass so as to decrease a solidifying point of the mass so that in gradually cooling step the melt may crystallize from the portion of the compact having the highest solidifying point to a direction of the portions of the compact having lower solidifying points thereby ensuring high orientation of grains in a composite.

The compacted mass is heated to a temperature which is higher than an incongruent melting temperature of $REBa_2Cu_3O_{7-x}$ so as to partially melt the $REBa_2Cu_3O_{7-x}$ in the mass and to decompose the $REBa_2Cu_3O_{7-x}$ into a melt and $RE_2BaCuO5$ in a solid state. However, this temperature is lower than an incongruent melting temperature of $RE_2BaCuO_5$ at which $RE_2BaCuO_5$ decomposes into a melt and $RE_2O_5$ in a solid state. During this heating step $RE_2BaCuO_5$ powder in the compacted mass is believed to remain as it is in a solid state.

The compacted mass may be placed into a furnace, and then heated at a rate of 100° C. to 400° C. per hour, preferably 200° C. to 300° C. per hour. Alternatively, the compacted mass may be placed into a furnace which was heated in advance to a desired temperature. Preferably the atmosphere during the heating step is an ambient atmosphere thereby facilitating the heating operation.

Preferably the mass is maintained at a steady temperature ranging from 950° C. to 1250° C. for a sufficient time to partially melt the $REBa_2Cu_3O_{7-x}$ in the mass. The sufficient time depends on a size of the mass and the steady temperature, and it may be at least 10 minutes for a mass having a disk shape with a diameter of 20 mm and a height of less than 5 mm.

The incongruent melting temperature of the compacted mass depends upon the kind of rare earth element, the kind and amount of a noble metal compound in the compact. In general a larger amount of a noble metal compound decreases an incongruent melting temperature of $REBa_2Cu_3O_{7-x}$. The steady temperature to keep the compacted mass may be, for example, in the range from about 1,000° C. to 1,200° C. for $YBa_2Cu_3O_{7-x}$, from about 1,040° C. to 1,230° C. for $SmBa_2Cu_3O_{7-x}$, from about 1,030° C. to 1,200° C. for $EuBa_2Cu_3O_{7-x}$, from about 1080° C. to 1,230° C. for $GdBa_2Cu_3O_{7-x}$, from about 1030° C. to 1,210° C. for $DyBa_2Cu_3O_{7-x}$, from about 1040° C. to 1,190° C. for $HoBa_2Cu_3O_{7-x}$, from about 1020° C. to 1,170° C. for $ErBa_2Cu_3O_{7-x}$, and from about 950° C. to 1,150° C. for $YbBa_2Cu_3O_{7-x}$.

Then the mass may be rapidly cooled at a rate ranging from 50° C. to 400° C. per hour to an initial temperature from which a gradually cooling starts. The initial temperature may be a temperature higher by 5° C. to 20° C. than the incongruent melting temperature of $REBa_2Cu_3O_{7-x}$.

Subsequently, the mass is gradually cooled so as to recrystallize $REBa_2Cu_3O_{7-x}$ from the melt. Gradually cooling the melt in the mass gives rise to a peritectic reaction of $RE_2BaCuO_5$ in a solid state with the melt to give a crystal growth of $REBa_2Cu_3O_{7-x}$ at an interface of $RE_2BaCuO_5$ particles and the melt. The melt includes the $RE_2BaCuO_5$ in a solid state due to the decomposition of $REBa_2Cu_3O_{7-x}$ and the $RE_2BaCuO_5$ particles from the starting material. The presence of a noble metal prevents $RE_2BaCuO_5$ particles from growing not more than 20 μm. In the present invention, the $RE_2BaCuO_5$ particles from the starting material are small from the beginning. The $RE_2BaCuO_5$ in a solid state due to the decomposition of $REBa_2Cu_3O_{7-x}$ are believed to be small because initial $REBa_2Cu_3O_{7-x}$ particles are small. These small particles of $RE_2BaCuO_5$ in the melt are related to the dispersion of small $RE_2BaCuO_5$ particles in a matrix composed of $REBa_2Cu_3O_{7-x}$ grains in the resulting composite.

The initial temperature from which the mass is gradually cooled may be a temperature higher by 5° C. to 20° C. than the incongruent melting temperature of $REBa_2Cu_3O_{7-x}$. The ending temperature at which the gradually cooling ends may be lower than the incongruent melting temperature by about 30° C. to 70° C. A rate of the gradual cooling may range from 0.1° C. to 2° C. per hour, and preferably from 0.2° C. to 1.5° C. per hour. For example, a mass including $YBa_2Cu_3O_{7-x}$ may be gradually cooled from a temperature ranging from 1050° C. to 980° C. to a temperature ranging from 940° C. to 850° C.

As disclosed in the U.S. patent application Ser. No. 08/037,005 and its corresponding European patent application 93302556.1, during the gradual cooling step a seed crystal, which is a small piece of a single crystal of, for example, $REBa_2Cu_3O_{7-x}$, may be placed onto the mass so as to provide nucleation sites for $REBa_2Cu_3O_{7-x}$ grains. The seed crystal may be single crystals of $SrTiO_3$, MgO, $LaAlO_3$, $LaGaO_3$, $NdGaO_3$, $PrGaO_3$ and the like which have the lattice constants of the (100) surface in their single crystals close to the lattice constant of the ab surface of $REBa_2Cu_3O_{7-x}$.

The rare earth superconductive composite after gradual cooling is heat-treated in an oxygen atmosphere at a given temperature in the same manner as in a known melting process, whereby the $REBa_2Cu_3O_{7-x}$ grains in the superconductive composite absorbs a sufficient amount of oxygen for adjusting a value of x to a positive real number up to 0.2 thereby ensuring superconductivity. The heat treatment in an oxygen atmosphere may be conducted at 600° C. for 5–10 hours, at 500° C. for 10–20 hours or at 400° C. for 20–50 hours.

In the method of the present invention small powder particles of $REBa_2Cu_3O_{7-x}$ and $RE_2BaCuO_5$ are used in a compacted mass in the partial melt process thereby increasing a critical current density of a resultant superconductive composite into more than 10,000 ampere per square centimeter. The composite obtained by the method of the present invention may be applied to various areas, for example, superconductive wires, a flying wheel, a structure for magnetic screening, etc.

EXAMPLES 1–5

$Y_2O_3$ powder, $BaCO_3$ powder and CuO powder were thoroughly mixed so as to have a molar ratio of Y:Ba:Cu to be 1:2:3 using a dry type pot mill for 6 hours. The mixture was spread on a silver plate in an ambient atmosphere, and calcined at 900° C. for 10 hours. The calcined material was pulverized in a rotary mill using zirconia balls, for a sufficient time to obtain calcined powders of $YBa_2Cu_3O_{7-x}$ having an average particle diameter of Table 1. For example, the powder was subject to the rotary mill about 15 hours for an average particle diameter of 6 μm.

It is noted that the average particle diameter depends on a calcining temperature and a period of time for pulverizing the calcined material in the rotary mill. For example, calcining the mixture at about 950° C. and pulverizing the calcined in the rotary mill for 8 hours led to the average particle diameter of about 13 μm.

$Y_2O_3$ powder, $BaCO_3$ powder and CuO powder were thoroughly mixed so as to have a molar ratio of Y:Ba:Cu to be 2:1:1 using a dry type pot mill for 6 hours. The mixture was spread on a silver plate in an ambient atmosphere, and calcined at 930° C. for 10 hours. The calcined material was pulverized in a rotary mill using zirconia balls, for a sufficient time to obtain calcined powder of $Y_2BaCuO_5$ having an average particle diameter of Table 1. For example, the powder was subject to the rotary mill about 15 hours for an average particle diameter of 6 μm. Alternatively, calcining the mixture at about 950° C. and pulverizing the calcined in the rotary mill for 8 hours led to the average particle diameter of about 15 μm.

Large powder particles having a diameter larger than 20 μm in both $YBa_2Cu_3O_{7-x}$ powder and $Y_2BaCuO_5$ powder were removed by a sieving method.

Powder particles having an average diameter of 3 μm of both $YBa_2Cu_3O_{7-x}$ and $Y_2BaCuO_5$ were obtained by a coprecipitation method using oxalate. In the coprecipitation method, yttrium nitrate, barium nitrate, and copper nitrate were dissolved in distilled water in a molar ratio of Y:Ba:Cu to 1:2:3, and an aqueous ammonia solution was added to the solution so as to adjust pH of the solution to be in the range of 4.0 to 4.6 and, preferably about 4.3. Then, a citrate solution was added to the solution to form oxalate complexes of barium, yttrium, and copper. While the solution was being mixed, ethanol was added to the solution so as to decrease solubility of the oxalate complexes, and the oxalate complexes started to coprecipitate. After filteration, the precipitate was dried and then fired at about 800° C. for six hours to give fine powder of $YBa_2Cu_3O_{7-x}$. After the firing step, pulverization is unnecessary. To obtain fine powder of $Y_2BaCuO_5$, the preparation method is the same as $YBa_2Cu_3O_{7-x}$ except that a molar ratio of Y:Ba:Cu in the starting solution is 2:1:1, and that the firing step requires 900° C. for five hours. The powder particles obtained by the coprecipitation method did not include large powder particles having diameters larger than 20 μm.

1 mole part of $YBa_2Cu_3O_{7-x}$ powder was mixed with 0.4 mole part of $Y_2BaCuO_5$ powder, and to the resultant mixture was added 1% by weight of platinum powder in proportion to the mixture. The platinum powder had an average particle diameter up to 4 μm and a maximum particle diameter up to 10 μm. The mixture was thoroughly mixed in a dry pot mill.

The resultant powder material was placed in a mold having a cylindrical shape with an internal diameter of 20 mm, and underwent press molding under a load of 500 kgf to give a green compact having a shape of a disk with a diameter of 20 mm where 1 kgf is equivalent to 9.80665N.

The green compact in an electrical furnace was heated to 1100° C. in an ambient atmosphere at a rate of 350° C. per hour. The green compact was held at 1,100° C. for 1 hour so as to partially melt $YBa_2Cu_3O_{7-x}$ and decompose $YBa_2Cu_3O_{7-x}$ into a melt and solid-state phases. The mass was cooled from 1,100° C. to 1,000° C. at a rate of 100° C. per hour. Then, the compact was slowly cooled from 1,000° C. to 900° C. at a rate of 1.0° C. per hour to solidify the melt. The mass was cooled in the furnace from 900° C. to temperatures below. Then, the atmosphere in the furnace was changed to an oxygen atmosphere and the fired mass was subject to a heat treatment at 650°–400° C. for 50 hours to obtain a rare earth superconductive composite.

A critical current density, which is abbreviated as Jc, of each composite was measured by a magnetization method at 77K under a magnetic flux density of 1 tesla. The test conditions and the result obtained are shown in Table 1.

TABLE 1

| | average particle diameter (μm) | | Jc (A/cm$^2$) |
|---|---|---|---|
| Ex. | $YBa_2Cu_3O_{7-x}$ | $Y_2BaCuO_5$ | at 77 K under 1 T |
| 1 | 3 | 6 | 18,000 |
| 2 | 6 | 6 | 15,000 |
| 3 | 6 | 3 | 18,000 |
| 4 | 3 | 3 | 19,000 |
| 5 | 5 | 5 | 17,000 |

COMPARATIVE EXAMPLES 1–3

As shown in Table 2, average particle diameters of $YBa_2Cu_3O_{7-x}$ powders and $Y_2BaCuO_5$ powders in Comparative Examples 1–3 were changed from Examples 1–5. The other conditions of Comparative Examples 1–3 were the same as those of Examples 1–5.

A critical current density of each composite was measured by a magnetization method at 77K under a magnetic flux density of 1 tesla. The test conditions and the result obtained are shown in Table 2.

TABLE 2

| Comp. Ex. | average particle diameter (μm) | | Jc (A/cm$^2$) at 77 K under 1 T |
|---|---|---|---|
| | $YBa_2Cu_3O_{7-x}$ | $Y_2BaCuO_5$ | |
| 1 | 8 | 6 | 10,000 |
| 2 | 13 | 6 | 5,000 |
| 3 | 3 | 15 | 6,000 |

Comparing Table 2 with Table 1, as an average particle diameter of $YBa_2Cu_3O_{7-x}$ and $Y_2BaCuO_5$ increases, a critical current density of a composite decreases.

A cross section of each composite was observed by an electron microscope. In any of the samples taken from Examples 1–5, $Y_2BaCuO_5$ particles dispersed in a matrix of $YBa_2Cu_3O_{7-x}$ grains had diameters smaller than 20 μm, and most of the fine particles had diameters less than 3 μm. In contrast, in any of the samples taken from the composites of Comparative Examples 1–3, a small number of $Y_2BaCuO_5$ particles dispersed in a matrix of $YBa_2Cu_3O_{7-x}$ grains had diameters larger than 20 μm.

COMPARATIVE EXAMPLES 4–6

As shown in Table 3, average particle diameters of $YBa_2Cu_3O_{7-x}$ powders and $Y_2BaCuO_5$ powders in Comparative Examples 4–6 were changed from Examples 1–5, and either $YBa_2Cu_3O_{7-x}$ powder or $Y_2BaCuO_5$ powder had a small portion of large particles having particle diameter larger than 20 μm. A content of the large particles in the powder is expressed in percent by weight in proportion to the powder in Table 3. The other conditions of Comparative Examples 4–6 were the same as those of Examples 1–5.

A critical current density of each composite was measured by a magnetization method at 77K under a magnetic flux density of 1 tesla. The test conditions and the result obtained are shown in Table 3.

TABLE 3

| Comp. Ex. | $YBa_2Cu_3O_{7-x}$ | | $Y_2BaCuO_5$ | | Jc (A/cm$^2$) at 77 K under 1 T |
|---|---|---|---|---|---|
| | aver.part. diameter (μm) | content of large part. (% by wt.) | aver.part. diameter (μm) | content of large part. (% by wt.) | |
| 4 | 5 | 0 | 6 | 10 | 10,000 |
| 5 | 6 | 10 | 5 | 0 | 7,000 |
| 6 | 6 | 15 | 5 | 0 | 4,000 |

Comparing Table 3 with Table 1, the presence of the large particles having diameters more than 20 μm in either powder decreases a critical current density of a composite.

EXAMPLES 6–14

In Examples 6–14, average particle diameters of $YBa_2Cu_3O_{7-x}$ powder and $Y_2BaCuO_5$ powder were 3μm, and these powders were obtained by a coprecipitation method using oxalates. In Examples 6–14, large powder particles having a diameter larger than 20 μm of both $YBa_2Cu_3O_{7-x}$ powder and $Y_2BaCuO_5$ powder were not present.

1 mole part of $YBa_2Cu_3O_{7-x}$ powder was mixed with a specified mole part shown in Table 4 of $Y_2BaCuO_5$ powder, and to the resultant mixture was added a specified percent shown in Table 4 by weight of powder of a noble metal compound in proportion to the mixture. The noble-metal-compound powder had an average particle diameter up to 6 μm, and a maximum particle diameter up to 20 μm.

This powder material was compacted, fired, and then annealed in the same way as Examples 1–5 to give a composite.

A critical current density of each composite was measured by a magnetization method at 77K under a magnetic flux density of 1 tesla. The test conditions and the result obtained are shown in Table 4.

TABLE 4

| Ex. | molar ratio of $Y_2BaCuO_5$$^a$ | noble metal compd. | | Jc (A/cm$^2$) at 77 K under 1 T |
|---|---|---|---|---|
| | | compd. | amount (wt. %)$^b$ | |
| 6 | 0.1 | Pt | 1 | 13,000 |
| 7 | 0.2 | Pt | 0.5 | 18,000 |
| 8 | 0.4 | Pt | 1 | 17,000 |
| 9 | 0.8 | Pt | 1 | 12,000 |
| 10 | 0.2 | Rh | 0.5 | 20,000 |
| 11 | 0.4 | $Ba_4CuPt_2O_9$ | 2 | 16,000 |
| 12 | 0.4 | $Ba_4CuPt_2O_9$ | 6 | 17,000 |
| 13 | 0.4 | $Ba_4CuRh_2O_9$ | 2 | 18,000 |
| 14 | 0.4 | $Y_2Ba_3Cu_2PtO_{10}$ | 2 | 16,000 |

$^a$a molar ratio of $Y_2BaCuO_5$ to $YBa_2Cu_3O_{7-x}$;
$^b$an amount of a noble metal compound in percent by weight in proportion to the sum of the $YBa_2Cu_3O_{7-x}$ powder and the $Y_2BaCuO_5$ powder.

COMPARATIVE EXAMPLES 7–13

1 mole part of $YBa_2Cu_3O_{7-x}$ powder was mixed with a specified mole part shown in Table 5 of $Y_2BaCuO_5$ powder, and to the resultant mixture was added a specified percent shown in Table 5 by weight of powder of: a noble metal compound in proportion to the mixture. The other conditions of Comparative Examples 7–13 were the same as those of Examples 6–14.

A critical current density of each composite was measured by a magnetization method at 77K under a magnetic flux density of 1 tesla. The test conditions and the result obtained are shown in Table 5.

TABLE 5

| Ex. | molar ratio of $Y_2BaCuO_5$$^a$ | noble metal compd. | | Jc (A/cm$^2$) at 77 K under 1 T |
|---|---|---|---|---|
| | | compd. | amount (wt. %)$^b$ | |
| 7 | 0 | Pt | 0.5 | 6,000 |
| 8 | 0.9 | Pt | 1 | 10,000 |
| 9 | 0.4 | none | — | 5,000 |
| 10 | 0.4 | Pt | 0.03 | 6,000 |
| 11 | 0.4 | Pt | 20 | 6,000 |
| 12 | 0.4 | $Ba_4CuPt_2O_9$ | 30 | 8,000 |
| 13 | 0.4 | $Y_2Ba_3Cu_2PtO_{10}$ | 0.05 | 6,000 |

TABLE 5-continued

| Ex. | molar ratio of $Y_2BaCuO_5$ [a] | noble metal compd. compd. | amount (wt. %)[b] | Jc (A/cm²) at 77 K under 1 T |
|---|---|---|---|---|

[a] a molar ratio of $Y_2BaCuO_5$ to $YBa_2Cu_3O_{7-x}$;
[b] an amount of a noble metal compound in percent by weight in proportion to the sum of the $YBa_2Cu_3O_{7-x}$ powder and the $Y_2BaCuO_5$ powder.

Comparing Table 5 with Table 4, the critical current density is increased when a molar ratio of $Y_2BaCuO_5$ to $YBa_2Cu_3O_{7-x}$ ranges from 0.1 to 0.8, and particularly from 0.2 to 0.5. The critical current density is also increased when an amount of a noble metal compound ranges from 0.05% to 10%, and particularly 0.5 to 6%, by weight in proportion to the sum of the $YBa_2Cu_3O_{7-x}$ powder and the $Y_2BaCuO_5$ powder.

It is obvious to a person skilled in the art that the different embodiments of the invention may vary within the scope of the claims presented below. The invention in its broader aspects is therefore not limited to the specific examples shown and described. Accordingly, departures may be made from the details shown in the example without departing from the spirit or scope of the disclosed general inventive concept.

What is claimed is:

1. A method for making a rare earth superconductive composite including a matrix of $REBa_2Cu_3O_{7-x}$ grains and, uniformly dispersed therein, fine particles of $RE_2BaCuO_5$, wherein RE is at least one element selected from the group consisting of Y, Nd, Sm, Eu, Gd, Dy, Ho, Er, Tm, Yb, and Lu, and x ranges from 0 to 1, said rare earth superconductive composite having a critical current density of not less than 17,000 A/cm² at 77K under one tesla, which comprises the steps of:

(1) forming a compacted mass by application of pressure to a powder material including powder particles of $REBa_2Cu_3O_{7-x}$ and powder particles of $RE_2BaCuO_5$ wherein said powder particles of $REBa_2Cu_3O_{7-x}$ have an average diameter not greater than 6 µm and a maximum diameter not greater than 20 µm, and said powder particles of $RE_2BaCuO_5$ have an average diameter not greater than 6 µm and a maximum diameter not greater than 20 µm;

(2) heating the compacted mass to a temperature which is higher than an incongruent melting temperature of $REBa_2Cu_3O_{7-x}$ and which is lower than an incongruent melting temperature of $RE_2BaCuO_5$ so as to partially melt and decompose the $REBa_2Cu_3O_{7-x}$ in the mass into a melt and to maintain the $RE_2BaCuO_5$ in a solid state;

(3) gradually cooling the mass from an initial temperature so as to recrystallize $REBa_2Cu_3O_{7-x}$ from the melt wherein fine particles of $RE_2BaCuO_5$ are dispersed in $REBa_2Cu_3O_{7-x}$ grains, wherein the melt contains a species to aid in dispersion of the $RE_2BaCuO_5$, said species comprising at least one element selected from the group consisting of Pt, Rh, Pd, Ru, Os and Sc, said melt containing 0.01% to 10% by weight, with respect to the sum of $RE_2BaCuO_5$ and $REBa_2CuO_{7-x}$, of said species; and (4) annealing the mass in an atmosphere containing oxygen for a time sufficient for a requisite amount of oxygen to diffuse into the mass.

2. A method according to claim 1, wherein said powder particles of $REBa_2Cu_3O_{7-x}$ have an average diameter not greater than 3 µm, and said powder particles of $RE_2BaCuO_5$ have an average diameter not greater than 3 µm.

3. A method according to claim 1, wherein said powder material in step (1) includes an amount of $RE_2BaCuO_5$ ranging from 10% to 80% by mole of an amount of $REBa_2Cu_3O_{7-x}$.

4. A method according to claim 1, wherein said species includes at least one element selected from the group consisting of Pt, Rh and Ru.

5. A method according to claim 1, wherein said species includes at least one element selected from the group consisting of Pt, Rh, Ru and Sc.

6. A method according to claim 1, wherein step (2) further includes a step of maintaining the mass at a steady temperature ranging from 950° C. to 1250° C. for a sufficient time to partially melt $REBa_2Cu_3O_{7-x}$.

7. A method according to claim 1, wherein in step (3) the mass is gradually cooled from a temperature ranging from 1050° C. to 980° C. to a temperature ranging from 940° C. to 850° C. at a rate ranging from 0.1° C. to 2° C. per hour.

8. A method according to claim 1, after step (2) and prior to step (3), further including a step of rapidly cooling the mass to said initial temperature of the mass at step (3) at a rate ranging from 50° C. to 400° C. per hour.

9. A method according to claim 1, wherein in step (3) an initial temperature from which the mass is gradually cooled is a temperature higher by 5° C. to 20° C. than the incongruent melting temperature of $REBa_2Cu_3O_{7-x}$, and an ending temperature to which the mass is gradually cooled is a temperature lower by at least 30° C. than the incongruent melting temperature of $REBa_2Cu_3O_{7-x}$.

10. The method of claim 1, wherein said rare earth superconductive composite has a critical current density of not less than 18,000 A/cm² at 77K under one tesla.

11. The method of claim 1, wherein said rare earth superconductive composite has a critical current density of not less than 19,000 A/cm² at 77K under one tesla.

12. A method for making a rare earth superconductive composite including a matrix of $REBa_2Cu_3O_{7-x}$ grains and, uniformly dispersed therein, fine particles of $RE_2BaCuO_5$, wherein RE is at least one element selected from the group consisting of Y, Nd, Sm, Eu, Gd, Dy, Ho, Er, Tm, Yb, and Lu, and x ranges from 0 to 1, said rare earth superconductive composite having a critical current density of not less than 17,000 A/cm² at 77K under one tesla, which consists essentially of the steps of:

(1) forming a compacted mass by application of pressure to a powder material including powder particles of $REBa_2Cu_3O_{7-x}$ and powder particles of $RE_2BaCuO_5$ wherein said powder particles of $REBa_2Cu_3O_{7-x}$ have an average diameter not greater than 6 µm and a maximum diameter not greater than 20 µm, and said powder particles of $RE_2BaCuO_5$ have an average diameter not greater than 6 µm and a maximum diameter not greater than 20 µm;

(2) heating the compacted mass to a temperature which is higher than an incongruent melting temperature of $REBa_2Cu_3O_{7-x}$ and which is lower than an incongruent melting temperature of $RE_2BaCuO_5$ so as to partially melt and decompose the $REBa_2Cu_3O_{7-x}$ in the mass into a melt and to maintain the $RE_2BaCuO_5$ in a solid state;

(3) gradually cooling the mass from an initial temperature so as to recrystallize $REBa_2Cu_3O_{7-x}$ from the melt wherein fine particles of $RE_2BaCuO_5$ are dispersed in $REBa_2Cu_3O_{7-x}$ grains, wherein the melt contains a species to aid in dispersion of the $RE_2BaCuO_5$, said species comprising at least one element selected from the group consisting of Pt, Rh, Pd, Ru, Os and Sc, said melt containing 0.01% to 10% by weight, with respect to the sum of $RE_2BaCuO_5$ and $REBa_2CuO_{7-x}$, of said species; and (4) annealing the mass in an atmosphere containing oxygen for a time sufficient for a requisite amount of oxygen to diffuse into the mass.

* * * * *